United States Patent
Ma et al.

(10) Patent No.: US 12,356,717 B2
(45) Date of Patent: Jul. 8, 2025

(54) ARRAY SUBSTRATE AND MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Qian Ma, Shenzhen (CN); Wei Lu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/778,855

(22) PCT Filed: Apr. 24, 2022

(86) PCT No.: PCT/CN2022/088806
§ 371 (c)(1),
(2) Date: May 22, 2022

(87) PCT Pub. No.: WO2023/197368
PCT Pub. Date: Oct. 19, 2023

(65) Prior Publication Data
US 2024/0178240 A1    May 30, 2024

(30) Foreign Application Priority Data
Apr. 14, 2022   (CN) .......................... 202210391961.4

(51) Int. Cl.
*H10D 30/67*    (2025.01)
*H10D 86/01*    (2025.01)
(Continued)

(52) U.S. Cl.
CPC ........... *H10D 86/60* (2025.01); *H10D 86/021* (2025.01); *H10D 86/451* (2025.01)

(58) Field of Classification Search
CPC ............. H01L 27/1248; H01L 27/1259; H01L 27/1225; H01L 29/78633; H01L 29/7869;
(Continued)

(56) References Cited

U.S. PATENT DOCUMENTS 12,022,683 B2 *   6/2024   Kim ..................... H10K 59/878
2015/0206905 A1 *   7/2015   Wang ................ H01L 29/78675
257/66
(Continued)

FOREIGN PATENT DOCUMENTS

CN   105118808 A   12/2015
CN   105702744 A   6/2016
(Continued)

OTHER PUBLICATIONS

PCT International Search Report for International Application No. PCT/CN2022/088806, mailed on Dec. 15, 2022, 8pp.
(Continued)

*Primary Examiner* — David Vu
(74) *Attorney, Agent, or Firm* — The Roy Gross Law Firm, LLC; Roy D. Gross

(57) ABSTRACT

The present disclosure provides an array substrate and a manufacturing method thereof, and a display panel. The array substrate includes an oxide semiconductor layer, a gate insulating layer, a gate electrode, an interlayer insulating layer, and a source-drain electrode metal layer located on a substrate. Wherein the oxide semiconductor layer includes a channel region and conductive regions, the gate insulating layer is respectively overlapped with the conductive regions on both sides of the channel region, and an orthographic projection of a part of the gate electrode corresponding to the
(Continued)

oxide semiconductor layer on the substrate falls within a range of an orthographic projection of the channel region on the substrate.

20 Claims, 9 Drawing Sheets

(51) Int. Cl.
    *H10D 86/40*     (2025.01)
    *H10D 86/60*     (2025.01)

(58) Field of Classification Search
    CPC ............. H01L 29/66969; H01L 27/127; H01L 29/78696

See application file for complete search history.

(56) References Cited

U.S. PATENT DOCUMENTS

2017/0256569 A1*   9/2017   Ohara ................ H01L 29/4908
2021/0313470 A1    10/2021   Ji et al.

FOREIGN PATENT DOCUMENTS

| CN | 110797355 A | 2/2020 |
|----|-------------|--------|
| CN | 113314615 A | 8/2021 |
| CN | 114141865 A | 3/2022 |

OTHER PUBLICATIONS

PCT Written Opinion of the International Search Authority for International Application No. PCT/CN2022/088806, mailed on Dec. 15, 2022, 9pp.

Chinese Office Action issued in corresponding Chinese Patent Application No. 202210391961.4 dated Aug. 27, 2024, pp. 1-9, 19pp.

* cited by examiner

```
┌─────────────────────────────────────────────┐
│ providing a substrate, and manufacturing an oxide │
│ semiconductor layer on the substrate.        │
└─────────────────────────────────────────────┘
                      │                              S1
                      ▼
┌─────────────────────────────────────────────┐
│ manufacturing a gate insulating layer, a gate electrode, │
│ and an interlayer insulating layer on the oxide │
│ semiconductor layer, and forming a channel region and │
│ conductive regions located at both sides of the channel │
│ region.                                      │
└─────────────────────────────────────────────┘
                      │                              S2
                      ▼
┌─────────────────────────────────────────────┐
│ orming via holes penetrating the interlayer insulating │
│ layer and exposing the conductive regions.   │
└─────────────────────────────────────────────┘
                      │                              S3
                      ▼
┌─────────────────────────────────────────────┐
│ manufacturing a source-drain electrode metal layer on │
│ the interlayer insulating layer, the source-drain electrode │
│ metal layer is electrically connected to the conductive │
│ regions through the via holes.               │
└─────────────────────────────────────────────┘
                                                     S4
```

FIG. 3 manufacturing the gate insulating layer and a gate transition layer stacked on the oxide semiconductor layer, and forming a first conductive region on a part of the oxide semiconductor layer not covered by the gate insulating layer.

S21

↓ making a first manufacture of the interlayer insulating layer, the interlayer insulating layer covers the first conductive region, at a same time, carriers in the first conductive region diffuse to a part of the oxide semiconductor layer corresponding to the gate insulating layer to form a second conductive region adjacent to the first conductive region.

S22

↓ etching the gate transition layer 25a to form the gate electrode 25.

S23

↓ making a second manufacture of the interlayer insulating layer to form the interlayer insulating layer covering the gate electrode, the gate insulating layer, and the oxide semiconductor layer, at the same time, the carriers in the first conductive region and the second conductive region diffuse towards a part of the oxide semiconductor layer corresponding to the gate electrode, to form a third conductive region between the part of the oxide semiconductor layer corresponding to the gate electrode and the second conductive region; wherein the first conductive region, the second conductive region, and the third conductive region constitute a conductive region.

S24

FIG. 4 manufacturing a gate insulating film, a gate metal film, and a photoresist on the oxide semiconductor layer in sequence, the photoresist including a reserved area, and a part of the photoresist except the reserved area is removed by a yellow light process. — S211 etching the gate insulating film and the gate metal film and removing a part of the gate insulating film and the gate metal film except the reserved area corresponding to the gate insulating film and the gate metal film, to form the gate insulating layer and the gate transition layer. — S212 making the part of the oxide semiconductor layer not covered by the gate insulating layer conductive to form the first conductive region. — S213

FIG. 5

ARRAY SUBSTRATE AND MANUFACTURING METHOD THEREOF, AND DISPLAY PANEL

CROSS REFERENCE TO RELATED APPLICATIONS

This application is a National Phase of PCT Patent Application No. PCT/CN2022/088806 having International filing date of Apr. 24, 2022, which claims the benefit of priority of Chinese Patent Application No. 202210391961.4, filed Apr. 14, 2022, the contents of which are all incorporated herein by reference in their entirety.

FIELD OF INVENTION

The present disclosure relates to a field of display technology, and particularly relates to an array substrate and a manufacturing method thereof, and a display panel.

BACKGROUND OF INVENTION

At present, in oxide semiconductor array substrates manufactured by a top gate self-alignment process, carriers in conductive regions of the oxide semiconductor are easily diffused to non-conductive regions due to subsequent thermal processes, and diffuse below a gate insulating layer, resulting in parasitic capacitance and short channel effects. Specifically, as shown in FIG. 1, which is a structural schematic diagram of an existing array substrate, the array substrate 100 includes a glass substrate 101, a light-shielding layer 102, a buffer layer 103, an oxide semiconductor layer 104, a gate insulating layer 105, a gate metal layer 106, an interlayer insulating layer 107, a source-drain electrode metal layer 108, and a passivation layer 109 stacked sequentially from bottom to top. Wherein the gate insulating layer 105 and the gate metal layer 106 are formed simultaneously. The oxide semiconductor layer 104 is made conductive with the top gate self-aligning process, a part of the oxide semiconductor layer 104 not covered by the gate insulating layer 105 is made conductive, however, carrier concentration in conductive regions 1041 of the oxide semiconductor layer 104 is high, the carriers are easily diffused in the subsequent thermal processes, and carrier diffusion regions are formed below the gate insulating layer 105, resulting in parasitic capacitance formed between the carrier diffusion regions L1 and the upper gate metal layer 106, and a length of an effective channel region 1042 formed below the gate insulating layer 105 becomes shorter, causing instability of devices. In addition, a size of the gate metal layer 106 is larger, which requires a large design space, resulting in a low aperture ratio and a low resolution of the array substrate.

Therefore, it is necessary to provide a technical solution to solve above problems.

Technical Problems

The present disclosure provides an array substrate, a manufacturing method thereof, and a display panel to solve technical problems that instability of thin film transistor (TFT) devices of existing array substrates and aperture ratios and resolutions of the array substrates are lower.

Technical Solutions

To solve above problems, technical solutions provided by the present disclosure are as follows:

The present disclosure provides an array substrate, including:
a substrate;
an oxide semiconductor layer disposed on the substrate, including a channel region and conductive regions located at both sides of the channel region;
a gate insulating layer disposed on a side of the oxide semiconductor layer away from the substrate;
a gate electrode disposed on a side of the gate insulating layer away from the substrate;
an interlayer insulating layer disposed on a side of the gate electrode away from the substrate; and
a source-drain electrode metal layer disposed on a side of the interlayer insulating layer away from the substrate, and electrically connected to the conductive regions through via holes penetrating the interlayer insulating layer;
wherein edges of the gate insulating layer are respectively overlapped with the conductive regions on the both sides of the channel region, and an orthographic projection of a part of the gate electrode corresponding to the oxide semiconductor layer on the substrate falls within a range of an orthographic projection of the channel region on the substrate.

Optionally, in some embodiments of the present disclosure, wherein the orthographic projection of the part of the gate electrode corresponding to the oxide semiconductor layer on the substrate coincides with the orthographic projection of the channel region on the substrate.

Optionally, in some embodiments of the present disclosure, wherein each of the conductive regions includes a first conductive region, a second conductive region, and a third conductive region, the second conductive region is located between the first conductive region and the third conductive region, and the second conductive region is in contact with the first conductive region and the third conductive region.

Optionally, in some embodiments of the present disclosure, wherein the gate insulating layer is overlapped with the second conductive region and the third conductive region.

Optionally, in some embodiments of the present disclosure, the interlayer insulating layer includes a first interlayer insulating layer and a second insulating layer, the first interlayer insulating layer is located at a side of the second insulating layer close to the substrate, and the gate electrode and the gate insulating layer are exposed from the first interlayer insulating layer.

Optionally, in some embodiments of the present disclosure, wherein a part of the conductive regions not covered by the gate insulating layer is covered by the first interlayer insulating layer, and the source-drain electrode metal layer is electrically connected to the conductive regions through the via holes penetrating the first interlayer insulating layer and the second interlayer insulating layer.

Optionally, in some embodiments of the present disclosure, wherein a metal light-shielding layer and a buffer layer are further disposed between the substrate and the oxide semiconductor layer, and the metal light-shielding layer is located at a side of the buffer layer away from the oxide semiconductor layer;
the source-drain electrode metal layer includes a source electrode and a drain electrode, wherein the drain electrode is electrically connected to the metal light-shielding layer through a contact hole penetrating the interlayer insulating layer and the buffer layer.

The present disclosure further provides a manufacturing method of an array substrate, including following steps:

S1, providing a substrate, and manufacturing an oxide semiconductor layer on the substrate;

S2, manufacturing a gate insulating layer, a gate electrode, and an interlayer insulating layer on the oxide semiconductor layer, and forming a channel region and conductive regions located at both sides of the channel region;

S3, forming via holes penetrating the interlayer insulating layer and exposing the conductive regions; and S4, manufacturing a source-drain electrode metal layer on the interlayer insulating layer, wherein the source-drain electrode metal layer is electrically connected to the conductive regions through the via holes;

wherein edges of the gate insulating layer are respectively overlapped with the conductive regions on the both sides of the channel region, and an orthographic projection of a part of the gate electrode corresponding to the oxide semiconductor layer on the substrate falls within a range of an orthographic projection of the channel region on the substrate.

Optionally, in some embodiments of the present disclosure, wherein the S2 includes following steps:

S21, manufacturing the gate insulating layer and a gate transition layer stacked on the oxide semiconductor layer, and forming a first conductive region on a part of the oxide semiconductor layer not covered by the gate insulating layer;

S22, making a first manufacture of the interlayer insulating layer, wherein the interlayer insulating layer covers the first conductive region, at a same time, carriers in the first conductive region diffuse to a part of the oxide semiconductor layer corresponding to the gate insulating layer to form a second conductive region adjacent to the first conductive region;

S23, etching the gate transition layer to form the gate electrode; and

S24, making a second manufacture of the interlayer insulating layer to form the interlayer insulating layer covering the gate electrode, the gate insulating layer, and the oxide semiconductor layer, at a same time, the carriers in the first conductive region and the second conductive region diffuse towards a part of the oxide semiconductor layer corresponding to the gate electrode, to form a third conductive region between the part of the oxide semiconductor layer corresponding to the gate electrode and the second conductive region;

wherein the first conductive region, the second conductive region, and the third conductive region constitute a conductive region.

Optionally, in some embodiments of the present disclosure, wherein the S21 includes following steps:

S211, manufacturing a gate insulating film, a gate metal film, and a photoresist on the oxide semiconductor layer in sequence, the photoresist including a reserved area, and a part of the photoresist except the reserved area is removed by a yellow light process;

S212, etching the gate insulating film and the gate metal film and removing a part of the gate insulating film and the gate metal film except the reserved area corresponding to the gate insulating film and the gate metal film, to form the gate insulating layer and the gate transition layer; and S213, making the part of the oxide semiconductor layer not covered by the gate insulating layer conductive to form the first conductive region.

Optionally, in some embodiments of the present disclosure, wherein the S22 includes following step:

making the first manufacture of the interlayer insulating layer on the oxide semiconductor layer and the reserved area of the photoresist to form a first interlayer insulating layer covering the first conductive region, at a same time, the carriers in the first conductive region diffuse to the part of the oxide semiconductor layer corresponding to the gate electrode to form the second conductive region adjacent to the first conductive region and overlapped with the gate insulating layer.

Optionally, in some embodiments of the present disclosure, wherein, after the S23, and before the S24, the manufacturing method further includes following step:

removing the reserved area of the photoresist and a part of the interlayer insulating layer covering the reserved area.

Optionally, in some embodiments of the present disclosure, wherein a part of the oxide semiconductor layer corresponding to the gate electrode constitutes the channel region, and the orthographic projection of the part of the gate electrode corresponding to the oxide semiconductor layer on the substrate coincides with the orthographic projection of the channel region on the substrate.

The present disclosure further provides a display panel, including an array substrate and an opposed substrate, the array substrate and the opposed substrate disposed opposite to each other, wherein the array substrate includes:

a substrate;

an oxide semiconductor layer disposed on the substrate, including a channel region and conductive regions located at both sides of the channel region;

a gate insulating layer disposed on a side of the oxide semiconductor layer away from the substrate;

a gate electrode disposed on a side of the gate insulating layer away from the substrate;

an interlayer insulating layer disposed on a side of the gate electrode away from the substrate; and a source-drain electrode metal layer disposed on a side of the interlayer insulating layer away from the substrate, and electrically connected to the conductive regions through via holes penetrating the interlayer insulating layer;

wherein edges of the gate insulating layer are respectively overlapped with the conductive regions on the both sides of the channel region, and an orthographic projection of a part of the gate electrode corresponding to the oxide semiconductor layer on the substrate falls within a range of an orthographic projection of the channel region on the substrate.

Optionally, in some embodiments of the present disclosure, wherein the orthographic projection of the part of the gate electrode corresponding to the oxide semiconductor layer on the substrate coincides with the orthographic projection of the channel region on the substrate.

Optionally, in some embodiments of the present disclosure, wherein each of the conductive regions includes a first conductive region, a second conductive region, and a third conductive region, the second conductive region is located between the first conductive region and the third conductive region, and the second conductive region is in contact with the first conductive region and the third conductive region.

Optionally, in some embodiments of the present disclosure, wherein the gate insulating layer is overlapped with the second conductive region and the third conductive region.

Optionally, in some embodiments of the present disclosure, wherein the interlayer insulating layer includes a first interlayer insulating layer and a second insulating layer, the first interlayer insulating layer is located at a side of the second insulating layer close to the substrate, and the gate electrode and the gate insulating layer are exposed from the first interlayer insulating layer.

Optionally, in some embodiments of the present disclosure, wherein a part of the conductive regions not covered by the gate insulating layer is covered by the first interlayer insulating layer, and the source-drain electrode metal layer is electrically connected to the conductive regions through the via holes penetrating the first interlayer insulating layer and the second interlayer insulating layer.

Optionally, in some embodiments of the present disclosure, wherein a metal light-shielding layer and a buffer layer are further disposed between the substrate and the oxide semiconductor layer, and the metal light-shielding layer is located at a side of the buffer layer away from the oxide semiconductor layer;

the source-drain electrode metal layer includes a source electrode and a drain electrode, wherein the drain electrode is electrically connected to the metal light-shielding layer through a contact hole penetrating the interlayer insulating layer and the buffer layer.

Beneficial Effects

The beneficial effects of the present disclosure are: an array substrate and a manufacturing method thereof, and a display panel provided by the present disclosure, by dividing a manufacture of an interlayer insulating layer into two stages, after completing a first manufacture of the interlayer insulating layer, a gate electrode with smaller size is formed by an etching process, and during a second manufacture of the interlayer insulating layer, with diffusion of carriers, conductive regions of the oxide semiconductor layer becomes longer and a channel region becomes narrower. Compared with the carriers in the oxide semiconductor layer diffusing below the gate electrode in traditional structures, the gate electrode of the present disclosure is not overlapped with a carrier diffusion part of the oxide semiconductor layer due to a reduced size of the gate electrode, therefore, it is beneficial to improving an aperture ratio and a resolution of the array substrate, avoid parasitic capacitance and short channel effects caused by diffused carriers meanwhile, and improve stability of TFT devices.

DESCRIPTION OF DRAWINGS

To describe the technical solutions of the embodiments of the present disclosure more clearly, the following briefly introduces the accompanying drawings used in the description of the embodiments of the present disclosure. Apparently, the accompanying drawings described below illustrate only some exemplary embodiments of the present disclosure, and persons skilled in the art may derive other drawings from the drawings without making creative efforts.

FIG. 3 is a flowchart of a manufacturing method of the array substrate provided by an embodiment of the present disclosure.

FIG. 4 is a flowchart of step S2 in the manufacturing method of the array substrate provided by an embodiment of the present disclosure.

FIG. 5 is a flowchart of step S21 in the manufacturing method of the array substrate provided by an embodiment of the present disclosure.

DETAILED DESCRIPTION OF EMBODIMENTS

Figure 1:
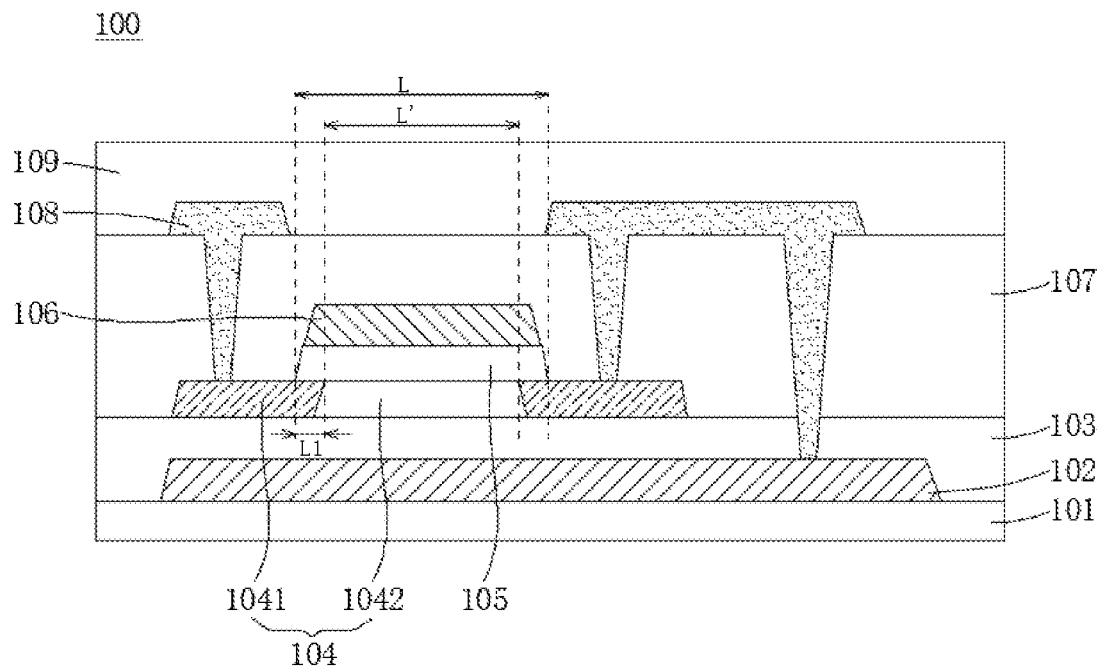
FIG. 1 is a structural schematic diagram of an existing array substrate.

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure. In addition, it should be understood that the specific embodiments described herein are only used to illustrate and explain the present disclosure and are not used to limit the present disclosure. In the present invention, in the absence of a contrary description, the location words used, such as "up" and "down", usually refer to the up and down under the actual use or working state of the device, specifically the drawing direction in the attached drawings; The "inside" and "outside" are for the contour of the device.

Figure 2:
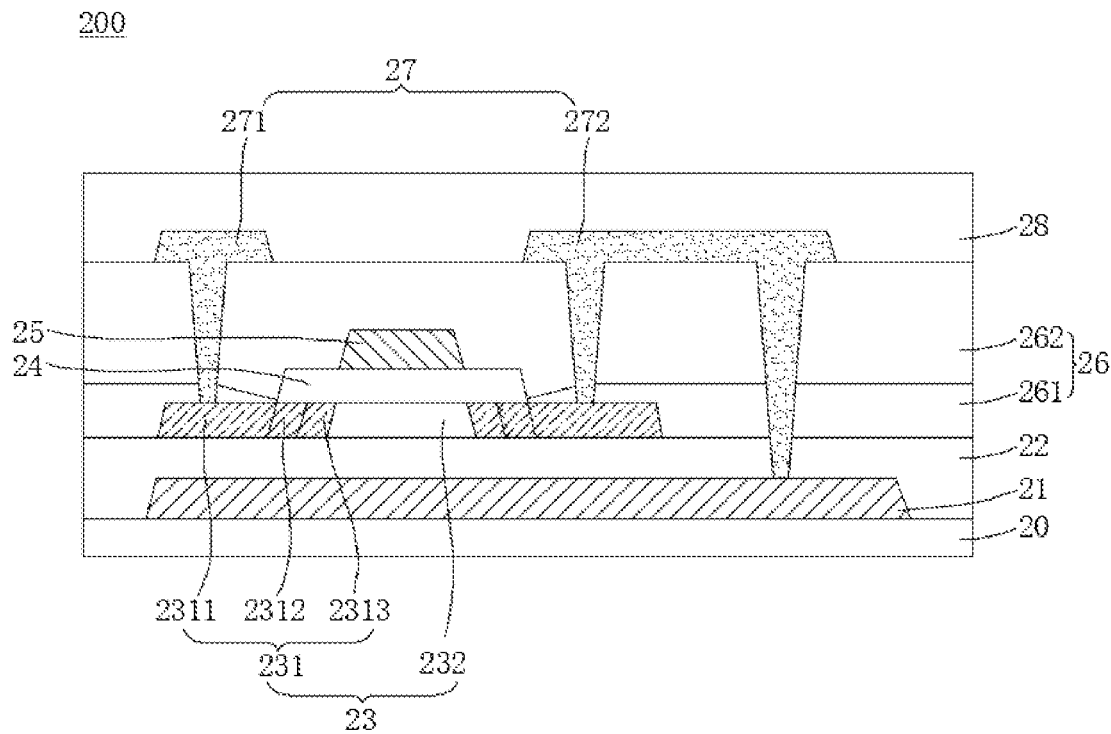
FIG. 2 is a structural schematic diagram of an array substrate provided by an embodiment of the present disclosure.

Referring to FIG. 2, FIG. 2 is a structural schematic diagram of an array substrate provided by an embodiment of the present disclosure. The embodiment of the present disclosure provides an array substrate 200, the array substrate 200 sequentially includes, from bottom to top, a glass substrate 20, a metal light-shielding layer 21, a buffer layer 22, an oxide semiconductor layer 23, a gate insulating layer 24, a gate electrode 25, an interlayer insulating layer 26, a source-drain electrode metal layer 27, and a passivation layer 28.

Wherein the metal light-shielding layer 21 is located on the glass substrate 20 to shield light emitted from a side of the substrate 20 to the oxide semiconductor layer 23. The metal light-shielding layer 21 is covered by the buffer layer 22. The oxide semiconductor layer 23 is disposed on a side of the buffer layer 22 away from the substrate 20, and the oxide semiconductor layer 23 includes a channel region 232 and conductive regions 231 located on both sides of the channel region 232. The gate insulating layer 24 is disposed on a side of the oxide semiconductor layer 23 away from the substrate 20, the gate electrode 25 is disposed on a side of the gate insulating layer 24 away from the substrate 20, and the interlayer insulating layer 26 is disposed on a side of the gate electrode 25 away from the substrate 20. The source-drain electrode metal layer 27 is disposed on a side of the interlayer insulating layer 26 away from the substrate 20, and is electrically connected to the conductive regions 231 through via holes penetrating the interlayer insulating layer 26. The passivation layer 28 is disposed on a side of the source-drain electrode metal layer 27 away from the substrate 20.

Wherein edges of the gate insulating layer 24 are respectively overlapped with the conductive regions 231 on the both sides of the channel region 232, and an orthographic projection of a part of the gate electrode 25 corresponding to the oxide semiconductor layer 23 on the substrate 20 falls within a range of an orthographic projection of the channel region 232 on the substrate 20.

Further, each of the conductive regions 231 includes a first conductive region 2311, a second conductive region 2312, and a third conductive region 2313. The second conductive region 2312 is located between the first conductive region 2311 and the third conductive region 2313, and is in contact with the first conductive region 2311 and the third conductive region 2313.

Further, the gate insulating layer 24 is overlapped with the second conductive region 2312 and the third conductive region 2313, and the orthographic projection of the part of the gate electrode 25 corresponding to the oxide semiconductor layer 23 on the substrate 20 coincides with the orthographic projection of the channel region 232 on the substrate 20.

It should be noted that, the first conductive region 2311 is formed during a process of making the oxide semiconductor layer 23 conductive, and the second conductive region 2312 and the third conductive region 2313 are formed after carriers in the first conductive region 2311 are heated and diffused in a direction close to the channel region 232 during subsequent thermal processes. Since the gate electrode 25 is not overlapped with the conductive regions 231 in a direction perpendicular to the substrate 20, therefore, the carriers in the first conductive region 2311 may not form parasitic capacitance with the gate electrode 25 after diffusing below the gate insulating layer 24 under an influence of the subsequent thermal processes, thereby improving stability of devices.

Further, the interlayer insulating layer 26 includes a first interlayer insulating layer 261 and a second interlayer insulating layer 262, the first interlayer insulating layer 261 is located at a side of the second insulating layer 262 close to the substrate 20, and the gate electrode 25 and the gate insulating layer 24 are exposed from the first interlayer insulating layer 261. Wherein a part of the conductive regions 231 not covered by the gate insulating layer 24 is covered by the first interlayer insulating layer 261, and the source-drain electrode metal layer 27 is electrically connected to the conductive regions 231 through via holes penetrating the first interlayer insulating 261 layer and the second interlayer insulating layer 262.

Wherein the source-drain electrode metal layer 27 includes a source electrode 271 and a drain electrode 272, wherein the source electrode 271 is electrically connected to the metal light-shielding layer 21 through a contact hole penetrating the interlayer insulating layer 26 and the buffer layer 22.

Referring to FIG. 1, during traditional manufacturing processes of the array substrate, a part of an oxide semiconductor layer 104 not covered by a gate insulating layer 105 needs to be conductive, however, during the subsequent thermal processes (for example, manufacturing an interlayer insulating layer 107), due to diffusion of carriers in parts of the oxide semiconductor layer 104 made conductive, a channel length of the oxide semiconductor layer 104 is shortened from L to L', which leads to a reduction of threshold voltages of thin film transistors with a shortening of the channel length, resulting in short channel effects.

Referring to FIG. 2, during a manufacturing process of the array substrate of the present disclosure, with diffusion of the carriers in the first conductive region 2311, a size of the gate electrode 25 is reduced to a smaller size, so that the part of the gate electrode 25 corresponding to the oxide semiconductor layer 23 corresponds to the channel region 232 formed after the diffusion of the carriers, thereby a length of the channel region 232 is not affected by the diffusion of the carriers during the thermal processes, and the short channel effects are avoided to improve the stability of the devices. In addition, since the size of the gate electrode 25 is reduced, wiring space is reduced, which is beneficial to improving an aperture ratio and a resolution of the array substrate.

Referring to FIG. 3-FIG. 5 and FIG. 6A-FIG. 6M, an embodiment of the present disclosure further provides a manufacturing method of the array substrate, including following steps:

S1, providing a substrate, and manufacturing an oxide semiconductor layer on the substrate.

Figure 6A:
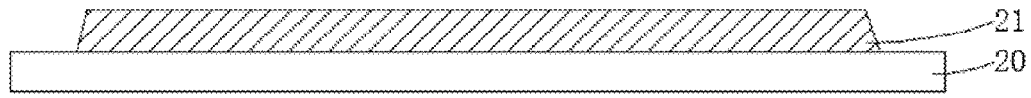
FIG. 6A to FIG. 6M are schematic diagrams of the manufacturing process of the array substrate provided by an embodiment of the present disclosure.
Figure 6B:
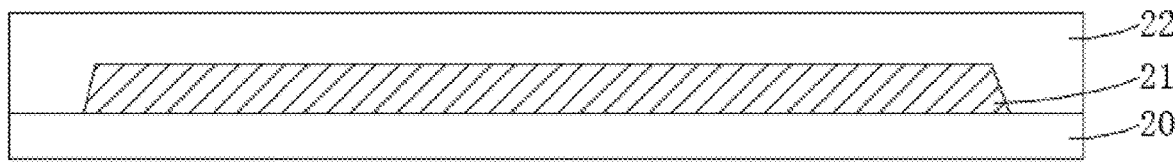

Specifically, referring to FIG. 6A-FIG. 6B, before manufacturing the oxide semiconductor layer in the step S1, the manufacturing method further includes: manufacturing the metal light-shielding layer 21 on the substrate 20, and then manufacturing the buffer layer 22 covering the metal light-shielding layer 21 on the metal light-shielding layer 21.

Wherein a thickness of the metal light-shielding layer 21 is 500 Å-2000 Å, and a material of the metal light-shielding layer 21 may be at least one of molybdenum (Mo), aluminum (Al), copper (Cu), and titanium (Ti). A thickness of the buffer layer 22 is 1000 Å-5000 Å, and a material of the buffer layer 22 may be at least one of silicon oxide ($SiO_x$) and silicon nitride ($SiN_x$).

Figure 6C:
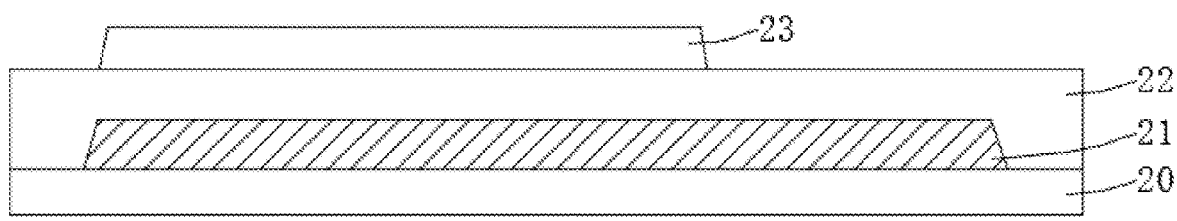

Referring to FIG. 6C, manufacturing the oxide semiconductor layer 23 on the buffer layer 22, and an orthographic projection of the oxide semiconductor layer 23 on the substrate 20 falls within a range of an orthographic projection of the metal light-shielding layer 21 on the substrate 20. Wherein a thickness of the oxide semiconductor layer 23 is 100 Å-1000 Å, and a material of the oxide semiconductor layer 23 may be one of indium gallium zinc oxide (IGZO), indium zinc tin oxide (IZTO), or indium gallium zinc tin oxide (IGZTO).

S2, manufacturing a gate insulating layer, a gate electrode, and an interlayer insulating layer on the oxide semiconductor layer, and forming a channel region and conductive regions located at both sides of the channel region.

Specifically, the S2 includes following steps:

S21, manufacturing the gate insulating layer and a gate transition layer stacked on the oxide semiconductor layer, and forming a first conductive region on a part of the oxide semiconductor layer not covered by the gate insulating layer.

Further, referring to FIG. 5 and FIG. 6D-FIG. 6F, the step S21 specifically includes following steps:

S211, manufacturing a gate insulating film, a gate metal film, and a photoresist on the oxide semiconductor layer in sequence, the photoresist including a reserved area, and a part of the photoresist except the reserved area is removed by a yellow light process.

Figure 6D:
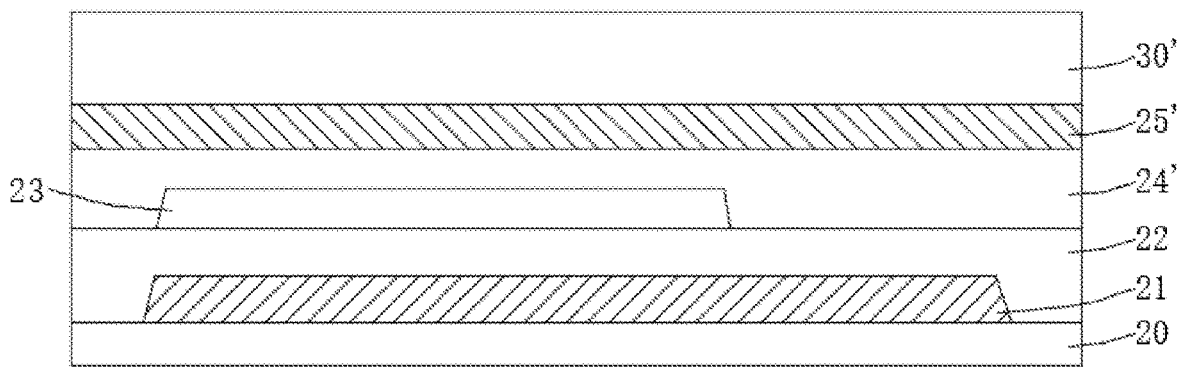

As shown in FIG. 6D, the gate insulating film 24', the gate metal film 25', and the photoresist 30' are sequentially manufactured on the oxide semiconductor layer 23.

Wherein a thickness of the gate insulating film 24' is 1000 Å-3000 Å, and a material of the gate insulating film 24' may be at least one of silicon oxide and silicon nitride. A thickness of the gate metal film 25' is 2000 Å-8000 Å, and a material of the gate metal film 25' may be at least one of molybdenum, aluminum, copper, and titanium.

Figure 6E:
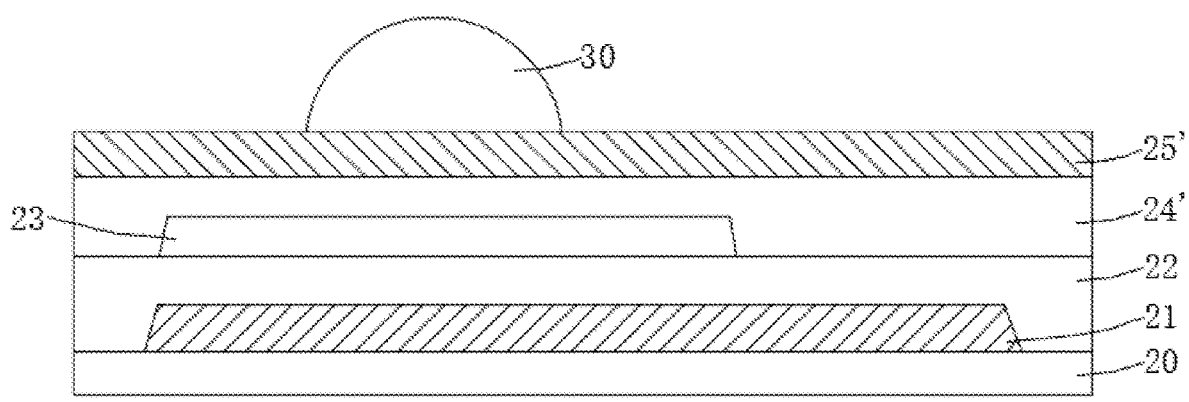

As shown in FIG. 6E, the photoresist 30' includes a reserved area 30, and a part of the photoresist 30' except the reserved area 30 is removed by the yellow light process.

S212, etching the gate insulating film and the gate metal film and removing a part of the gate insulating film and the gate metal film except the reserved area corresponding to the gate insulating film and the gate metal film, to form the gate insulating layer and the gate transition layer.

Figure 6F:
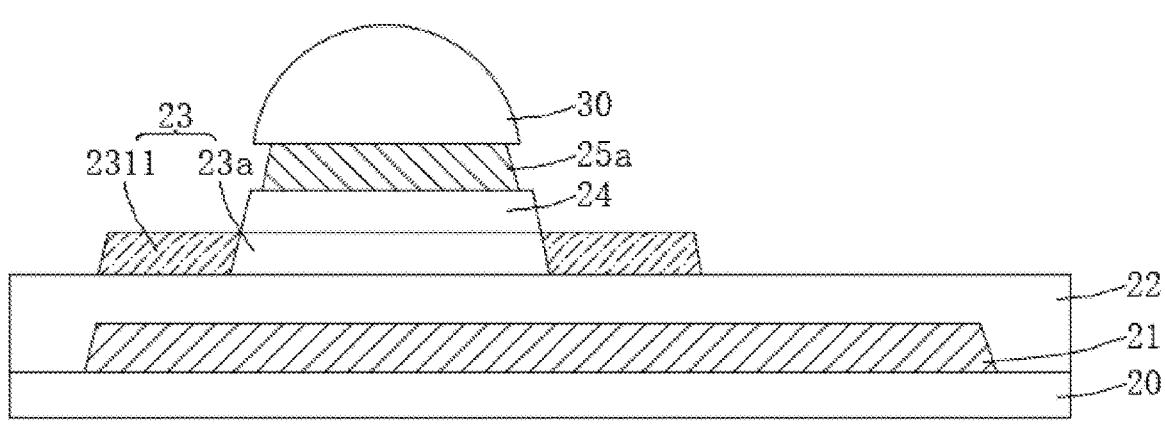

As shown in FIG. 6F, firstly, the gate metal film 25' is etched, and the part of the gate metal film 25' except the reserved area 30 corresponding to the gate metal film 25' is removed to form a gate transition layer 25a. Then, the gate insulating film 24' is etched by using the gate transition layer 25a as self-alignment, and a part of the gate insulating film 24' corresponding to the gate transition layer 25a is removed to form the gate insulating layer 24.

Wherein, the etching of the gate metal film 25' is over-etching, and an orthographic projection of the gate transition layer 25a on the substrate 20 falls within a range of an orthographic projection of the gate insulating layer 24 on the substrate 20.

S213, making the part of the oxide semiconductor layer not covered by the gate insulating layer conductive to form the first conductive region.

Continue to refer to FIG. 6F, conducting the part of the oxide semiconductor layer 23 not covered by the gate insulating layer 24 to form the first conductive region 2311. Wherein a part 23a of the oxide semiconductor layer 23 corresponding to the gate insulating layer 24 is left not conductive.

After the step S21 is manufactured completely, the S2 further includes following steps:

S22, making a first manufacture of the interlayer insulating layer, the interlayer insulating layer covers the first conductive region, at a same time, carriers in the first conductive region diffuse to a part of the oxide semiconductor layer corresponding to the gate insulating layer to form a second conductive region adjacent to the first conductive region.

Figure 6G:
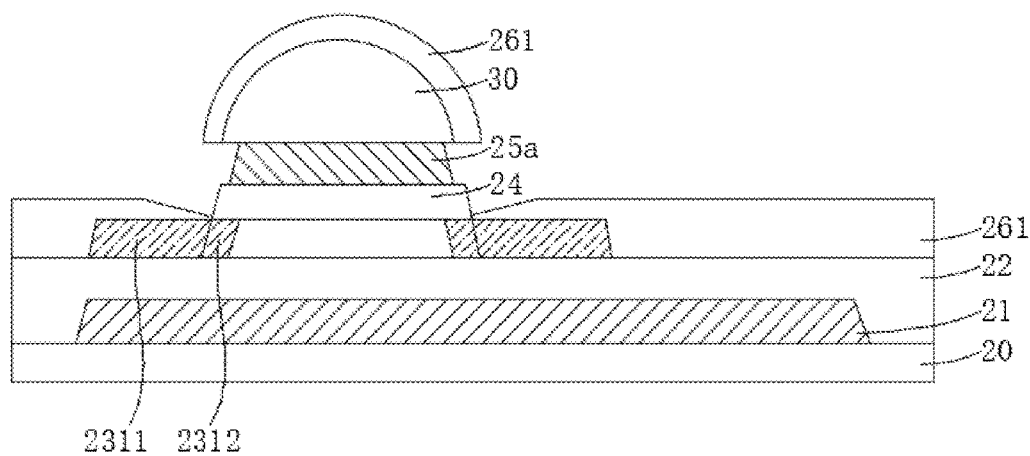

The present disclosure divides a manufacture of the interlayer insulating layer 26 into two stages, referring to FIG. 6G, firstly, the first manufacture of the interlayer insulating layer is conducted on the oxide semiconductor layer 23 and the reserved area 30 of the photoresist by a CVD process to form the first interlayer insulating layer 261, the first interlayer insulating layer 261 is disconnected at edges of the reserved area 30 and covers the first conductive region 2311. Since the CVD process is a thermal process, therefore, during the process of forming the first interlayer insulating layer 261, the carriers in the first conductive region 2311 diffuse to the part 23a of the oxide semiconductor layer 23 corresponding to the gate insulating layer 24 to form the second conductive region 2312 adjacent to the first conductive region 2311.

Wherein a thickness of the first interlayer insulating layer 261 is 500 Å-2000 Å, and a material of the first interlayer insulating layer 261 may be at least one of silicon oxide and silicon nitride, or may also be an organic material.

Figure 6H:
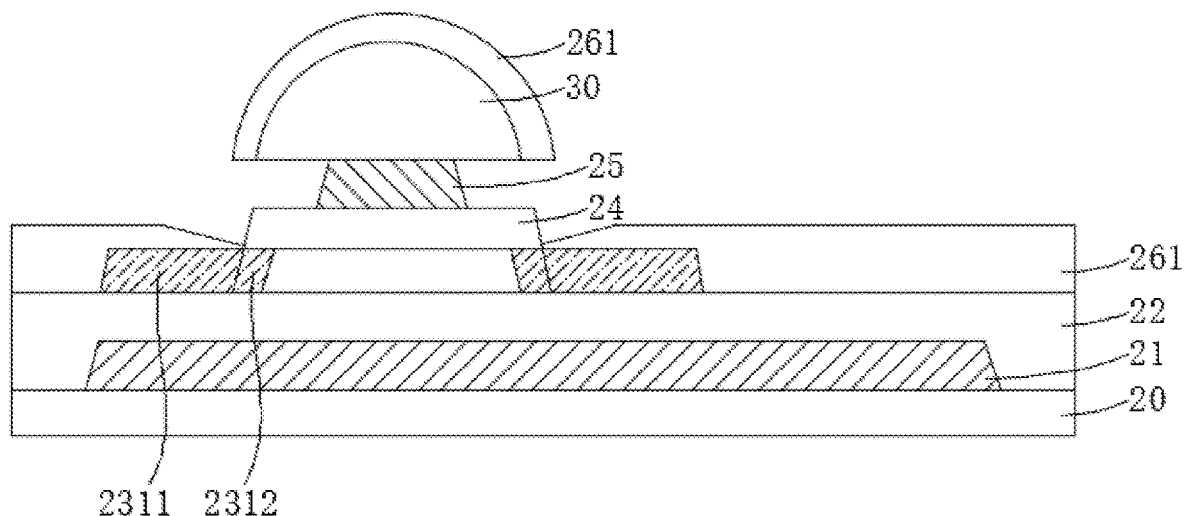

S23, referring to FIG. 6H, etching the gate transition layer 25a to form the gate electrode 25.

Figure 6I:
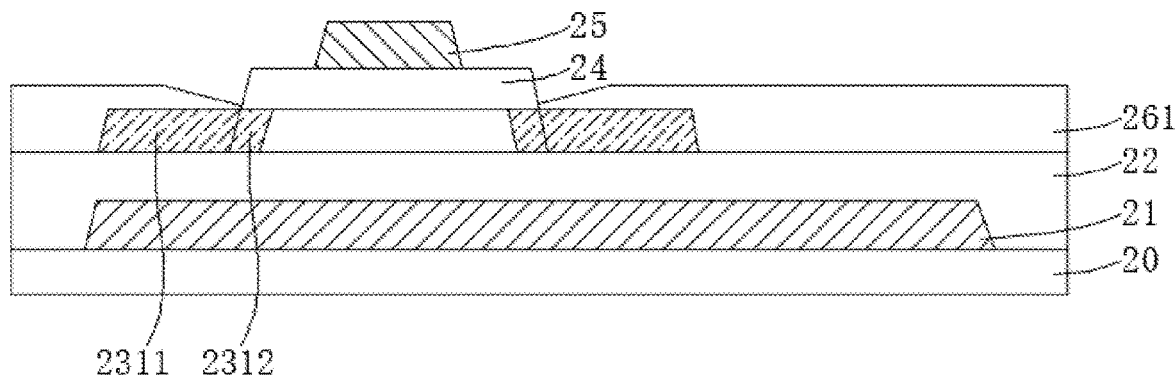

Referring to FIG. 6I, after the gate electrode 25 is formed, the reserved area 30 of the photoresist and a part of the first interlayer insulating layer 261 covering the reserved area 30 are removed together.

S24, making a second manufacture of the interlayer insulating layer to form the interlayer insulating layer covering the gate electrode, the gate insulating layer, and the oxide semiconductor layer, at the same time, the carriers in the first conductive region and the second conductive region diffuse towards a part of the oxide semiconductor layer corresponding to the gate electrode, to form a third conductive region between the part of the oxide semiconductor layer corresponding to the gate electrode and the second conductive region; wherein the first conductive region, the second conductive region, and the third conductive region constitute a conductive region.

Figure 6J:
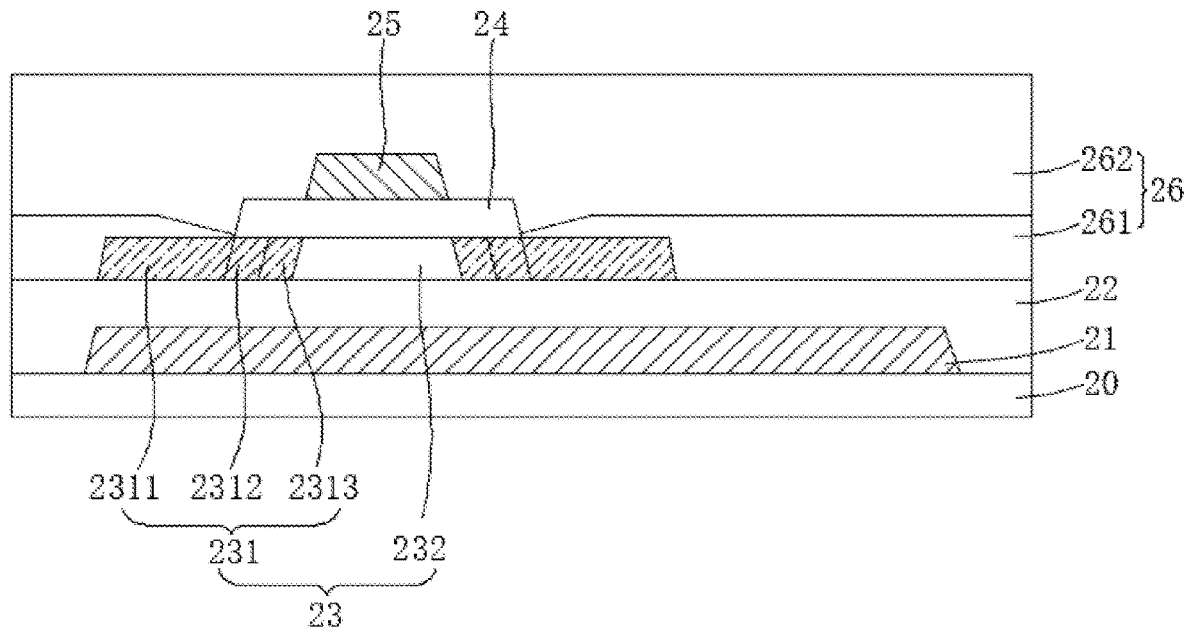

Referring to FIG. 6J, manufacturing the second interlayer insulating layer 262 on the gate electrode 25, the gate insulating layer 24, and the oxide semiconductor layer 23 by the CVD process, and at the same time, affected by high temperature film formation, the carriers in the first conductive region 2311 and the second conductive region 2312 diffuse to the part close to the oxide semiconductor layer 23 corresponding to the gate electrode 25, and the third conductive region 2313 is formed between the part of the oxide semiconductor layer 23 corresponding to the gate electrode 25 and the second conductive region 2312.

Wherein the first conductive region 2311, the second conductive region 2312, and the third conductive region 2313 constitute a conductive region 231, and the part of the oxide semiconductor layer 23 corresponding to the gate electrode 25 constitute the channel region 232.

Wherein the orthographic projection of the part of the gate electrode 25 corresponding to the oxide semiconductor layer 23 on the substrate 20 coincides with the orthographic projection of the channel region 232 on the substrate 20.

Wherein a thickness of the second interlayer insulating layer 262 is 2000 Å-10000 Å, and a material of the second interlayer insulating layer 262 may be at least one of silicon oxide and silicon nitride, or may also be the organic material.

After the step S2 is manufactured completely, the manufacturing method of the array substrate further includes following steps:

S3, forming via holes penetrating the interlayer insulating layer and exposing the conductive regions.

Figure 6K:
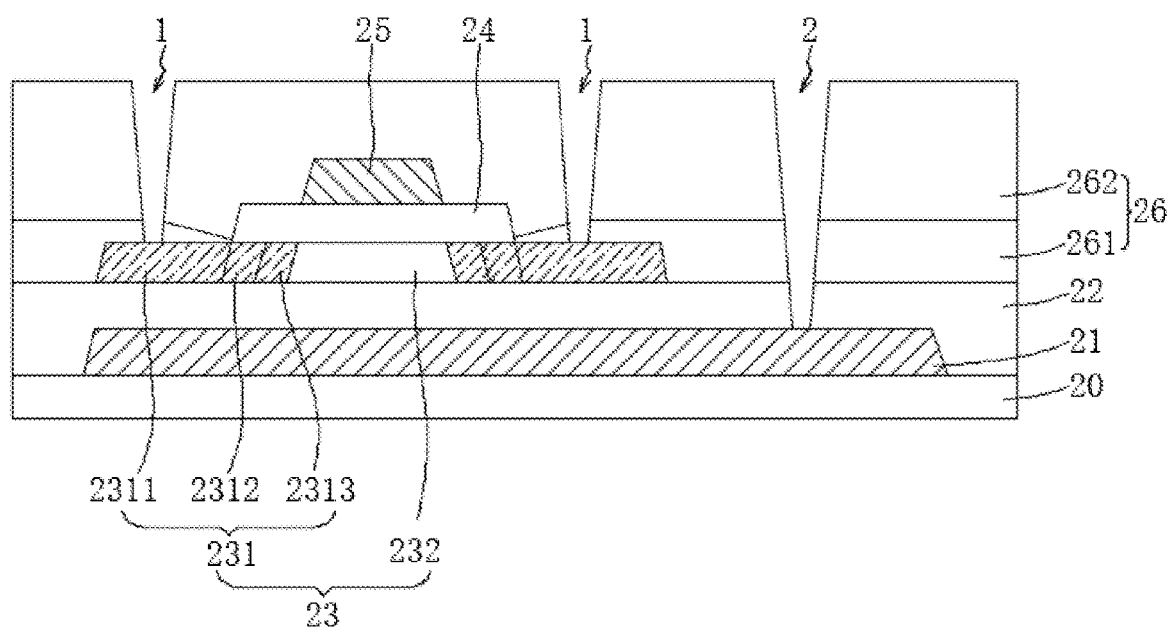

Specifically, referring to FIG. 6K, through a yellow photo etching process, via holes 1 penetrating the interlayer insulating layer 26 and exposing the conductive region 231, and a contact hole 2 penetrating the interlayer insulating layer 26 and the buffer layer 22 and exposing the metal light-shielding layer 21 are etched.

S4, manufacturing a source-drain electrode metal layer on the interlayer insulating layer, the source-drain electrode metal layer is electrically connected to the conductive regions through the via holes.

Figure 6L:
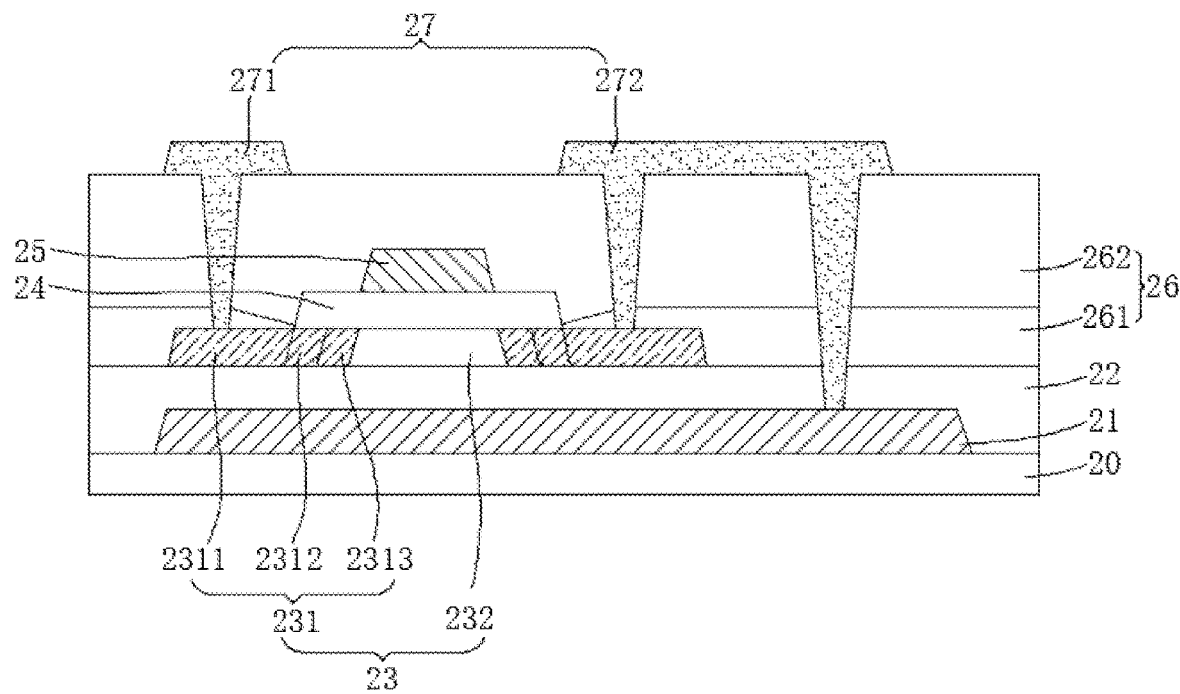

Specifically, referring to FIG. 6L, manufacturing the source-drain electrode metal layer 27 on the interlayer insulating layer 26, the source-drain electrode metal layer 27 includes a source electrode 271 and a drain electrode 272, the source electrode 271 and the drain electrode 272 are respectively electrically connected to the conductive regions 231 through the corresponding via holes 1, and the drain electrode 272 are further electrically connected to the light-shielding metal layer 21 through the contact hole 2.

Wherein a thickness of the source-drain electrode metal layer 27 is 2000 Å-8000 Å, and a material of the source-drain electrode metal layer 27 may be at least one of molybdenum, aluminum, copper, and titanium.

Figure 6M:
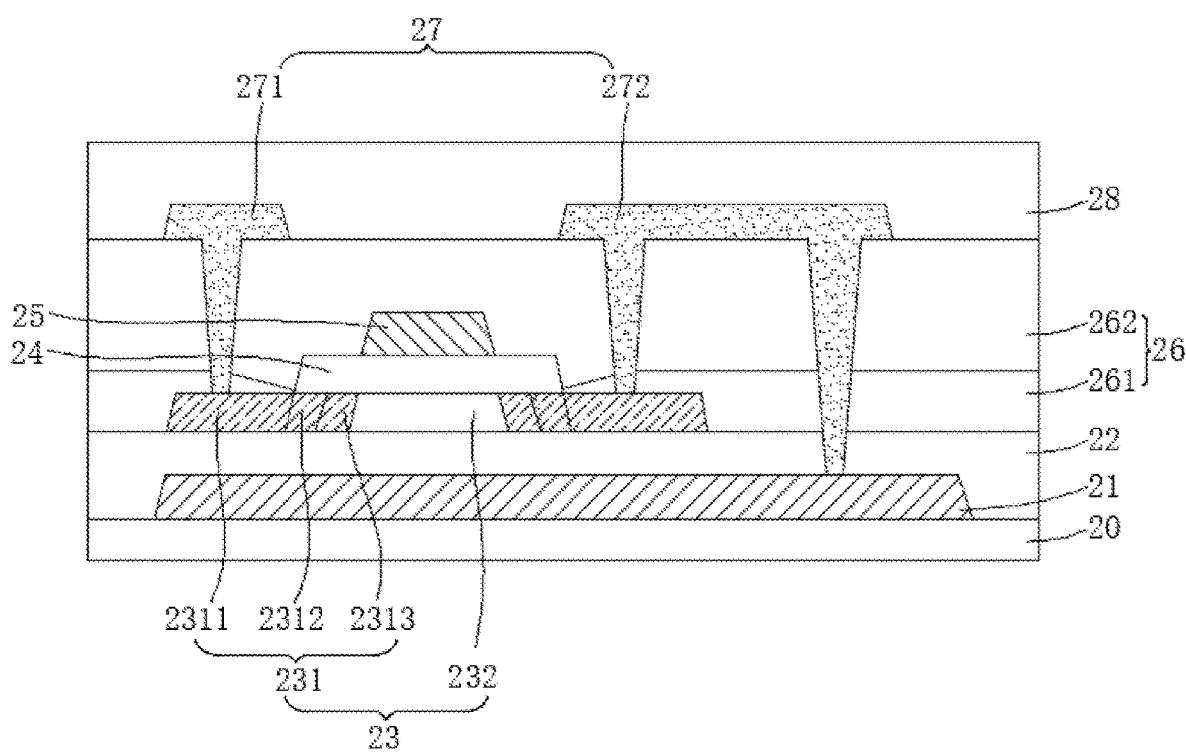

Referring to FIG. 6M, after the step S4, the manufacturing method may further include: manufacturing the passivation layer 28 on the source-drain electrode metal layer 27.

Wherein the passivation layer 28 is configured to protect thin film transistors from being invaded by external air and water vapor.

An embodiment of the present disclosure further provides a display panel, including the array substrate as described above and an opposite substrate, and the array substrate and the opposed substrate are disposed opposite to each other. Wherein the display panel may be one of a liquid crystal display panel, an organic light-emitting display panel, a quantum dot display panel, a mini-light emitting diode (LED) display panel, and a micro-LED display panel, which is not limited here.

The present disclosure divides the manufacture of the interlayer insulating layer into two stages based on a fact that the carriers may diffuse below the gate insulating layer under an influence of the subsequent high temperature film formation, after completing the manufacture of the first interlayer insulating layer, the gate electrode with a smaller size is formed by an etching process, and when manufacturing the second interlayer insulating layer, with the diffusion of the carriers, the lengths of the conductive regions of the oxide semiconductor layer become longer and form the channel region corresponding to the gate electrode. Compared with the carriers in the oxide semiconductor layer diffusing below the gate electrode in traditional structures, the gate electrode of the present disclosure is not overlapped with a carrier diffusion part of the oxide semiconductor layer due to its reduced size, therefore, the parasitic capacitance and the short channel effects caused by the diffused carriers are avoided to improve the stability of the thin film transistor devices. In addition, since the size of the gate electrode is reduced, it is beneficial to improving the aperture ratio and the resolution of the array substrate.

The embodiments of the present disclosure are described in detail above. The principle and implementations of the present disclosure are described in this specification by using specific examples. The description about the foregoing embodiments is merely provided to help understand the method and core ideas of the present disclosure. In addition, persons of ordinary skill in the art can make modifications in terms of the specific implementations and application scopes according to the ideas of the present disclosure. Therefore, the content of this specification shall not be construed as a limit to the present disclosure.

What is claimed is:

1. An array substrate, comprising:
    a substrate;
    an oxide semiconductor layer disposed on the substrate, comprising a channel region and conductive regions located at both sides of the channel region;
    a gate insulating layer disposed on a side of the oxide semiconductor layer away from the substrate;
    a gate electrode disposed on a side of the gate insulating layer away from the substrate;
    an interlayer insulating layer disposed on a side of the gate electrode away from the substrate; and
    a source-drain electrode metal layer disposed on a side of the interlayer insulating layer away from the substrate, and electrically connected to the conductive regions through via holes penetrating the interlayer insulating layer;
    wherein edges of the gate insulating layer are respectively overlapped with the conductive regions on the both sides of the channel region, and an orthographic projection of a part of the gate electrode corresponding to the oxide semiconductor layer on the substrate falls within a range of an orthographic projection of the channel region on the substrate; and
    wherein the interlayer insulating layer comprises a first interlayer insulating layer and a second insulating layer, the first interlayer insulating layer is located at a side surface of the second insulating layer close to the substrate, and the gate electrode and the gate insulating layer are exposed from the first interlayer insulating layer.

2. The array substrate in claim 1, wherein the orthographic projection of the part of the gate electrode corresponding to the oxide semiconductor layer on the substrate coincides with the orthographic projection of the channel region on the substrate.

3. The array substrate in claim 1, wherein each of the conductive regions comprises a first conductive region, a second conductive region, and a third conductive region, the second conductive region is located between the first conductive region and the third conductive region, and the second conductive region is in contact with the first conductive region and the third conductive region.

4. The array substrate in claim 3, wherein the gate insulating layer is overlapped with the second conductive region and the third conductive region.

5. The array substrate in claim 1, wherein a part of the conductive regions not covered by the gate insulating layer is covered by the first interlayer insulating layer, and the source-drain electrode metal layer is electrically connected to the conductive regions through the via holes penetrating the first interlayer insulating layer and the second interlayer insulating layer.

6. The array substrate in claim 1, wherein a metal light-shielding layer and a buffer layer are further disposed between the substrate and the oxide semiconductor layer, and the metal light-shielding layer is located at a side of the buffer layer away from the oxide semiconductor layer;
    the source-drain electrode metal layer comprises a source electrode and a drain electrode, wherein the drain electrode is electrically connected to the metal light-shielding layer through a contact hole penetrating the interlayer insulating layer and the buffer layer.

7. The array substrate in claim 1, wherein the first interlayer insulating layer abuts against a side surface of the gate insulating layer in a direction perpendicular to a thickness direction of the array substrate.

8. A manufacturing method of an array substrate, comprising following steps:
    S1, providing a substrate, and manufacturing an oxide semiconductor layer on the substrate;
    S2, manufacturing a gate insulating layer, a gate electrode, and an interlayer insulating layer on the oxide semiconductor layer, and forming a channel region and conductive regions located at both sides of the channel region;
    S3, forming via holes penetrating the interlayer insulating layer and exposing the conductive regions; and
    S4, manufacturing a source-drain electrode metal layer on the interlayer insulating layer, wherein the source-drain electrode metal layer is electrically connected to the conductive regions through the via holes;
    wherein edges of the gate insulating layer are respectively overlapped with the conductive regions on the both sides of the channel region, and an orthographic projection of a part of the gate electrode corresponding to the oxide semiconductor layer on the substrate falls within a range of an orthographic projection of the channel region on the substrate; and
    wherein the interlayer insulating layer comprises a first interlayer insulating layer and a second insulating layer, the first interlayer insulating layer is located at a surface of the second insulating layer close to the substrate, and the gate electrode and the gate insulating layer are exposed from the first interlayer insulating layer.

9. The manufacturing method of the array substrate in claim 8, wherein the S2 comprises following steps:

S21, manufacturing the gate insulating layer and a gate transition layer stacked on the oxide semiconductor layer, and forming a first conductive region on a part of the oxide semiconductor layer not covered by the gate insulating layer;

S22, making a first manufacture of the interlayer insulating layer, wherein the interlayer insulating layer covers the first conductive region, at a same time, carriers in the first conductive region diffuse to a part of the oxide semiconductor layer corresponding to the gate insulating layer to form a second conductive region adjacent to the first conductive region;

S23, etching the gate transition layer to form the gate electrode; and

S24, making a second manufacture of the interlayer insulating layer to form the interlayer insulating layer covering the gate electrode, the gate insulating layer, and the oxide semiconductor layer, at a same time, the carriers in the first conductive region and the second conductive region diffuse towards a part of the oxide semiconductor layer corresponding to the gate electrode, to form a third conductive region between the part of the oxide semiconductor layer corresponding to the gate electrode and the second conductive region;

wherein the first conductive region, the second conductive region, and the third conductive region constitute a conductive region.

10. The manufacturing method of the array substrate in claim 9, wherein the S21 comprises following steps:

S211, manufacturing a gate insulating film, a gate metal film, and a photoresist on the oxide semiconductor layer in sequence, the photoresist comprising a reserved area, and a part of the photoresist except the reserved area is removed by a yellow light process;

S212, etching the gate insulating film and the gate metal film and removing a part of the gate insulating film and the gate metal film except the reserved area corresponding to the gate insulating film and the gate metal film, to form the gate insulating layer and the gate transition layer; and S213, making the part of the oxide semiconductor layer not covered by the gate insulating layer conductive to form the first conductive region.

11. The manufacturing method of the array substrate in claim 10, wherein the S22 comprises following step:

making the first manufacture of the interlayer insulating layer on the oxide semiconductor layer and the reserved area of the photoresist to form a first interlayer insulating layer covering the first conductive region, at a same time, the carriers in the first conductive region diffuse to the part of the oxide semiconductor layer corresponding to the gate electrode to form the second conductive region adjacent to the first conductive region and overlapped with the gate insulating layer.

12. The manufacturing method of the array substrate in claim 11, wherein, after the S23, and before the S24, the manufacturing method further comprises following step:

removing the reserved area of the photoresist and a part of the interlayer insulating layer covering the reserved area.

13. The manufacturing method of the array substrate in claim 8, wherein the part of the oxide semiconductor layer corresponding to the gate electrode constitutes the channel region, and the orthographic projection of the part of the gate electrode corresponding to the oxide semiconductor layer on the substrate coincides with the orthographic projection of the channel region on the substrate.

14. A display panel, comprising an array substrate and an opposed substrate, the array substrate and the opposed substrate disposed opposite to each other, wherein the array substrate comprises:

a substrate;

an oxide semiconductor layer disposed on the substrate, comprising a channel region and conductive regions located at both sides of the channel region;

a gate insulating layer disposed on a side of the oxide semiconductor layer away from the substrate;

a gate electrode disposed on a side of the gate insulating layer away from the substrate;

an interlayer insulating layer disposed on a side of the gate electrode away from the substrate; and a source-drain electrode metal layer disposed on a side of the interlayer insulating layer away from the substrate, and electrically connected to the conductive regions through via holes penetrating the interlayer insulating layer;

wherein edges of the gate insulating layer are respectively overlapped with the conductive regions on the both sides of the channel region, and an orthographic projection of a part of the gate electrode corresponding to the oxide semiconductor layer on the substrate falls within a range of an orthographic projection of the channel region on the substrate; and wherein the interlayer insulating layer comprises a first interlayer insulating layer and a second insulating layer, the first interlayer insulating layer is located at a surface of the second insulating layer close to the substrate, and the gate electrode and the gate insulating layer are exposed from the first interlayer insulating layer.

15. The display panel in claim 14, wherein the orthographic projection of the part of the gate electrode corresponding to the oxide semiconductor layer on the substrate coincides with the orthographic projection of the channel region on the substrate.

16. The display panel in claim 14, wherein each of the conductive regions comprises a first conductive region, a second conductive region, and a third conductive region, the second conductive region is located between the first conductive region and the third conductive region, and the second conductive region is in contact with the first conductive region and the third conductive region.

17. The display panel in claim 16, wherein the gate insulating layer is overlapped with the second conductive region and the third conductive region.

18. The display panel in claim 14, wherein a part of the conductive regions not covered by the gate insulating layer is covered by the first interlayer insulating layer, and the source-drain electrode metal layer is electrically connected to the conductive regions through the via holes penetrating the first interlayer insulating layer and the second interlayer insulating layer.

19. The display panel in claim 14, wherein a light-shielding metal layer and a buffer layer are further disposed between the substrate and the oxide semiconductor layer, and the metal light-shielding layer is located at a side of the buffer layer away from the oxide semiconductor layer;

the source-drain electrode metal layer comprises a source electrode and a drain electrode, wherein the drain electrode is electrically connected to the metal light-shielding layer through a contact hole penetrating the interlayer insulating layer and the buffer layer.

20. The display panel in claim 14, wherein the first interlayer insulating layer abuts against a side surface of the gate insulating layer in a direction perpendicular to a thickness direction of the array substrate.

* * * * *